(12) United States Patent
D'Agostino et al.

(10) Patent No.: US 10,012,794 B2
(45) Date of Patent: Jul. 3, 2018

(54) PHASE DEPENDENT MULTIMODE INTERFERENCE DEVICE FOR COUPLED CAVITY LASERS (71) Applicant: Technische Universiteit Eindhoven, Eindhoven (NL)

(72) Inventors: Domenico D'Agostino, Eindhoven (NL); Daan Lenstra, Blaricum (NL)

(73) Assignee: Technische Universiteit Eindhoven, Eindhoven (NL)

( * ) Notice: Subject to any disclaimer, the term of this patent is extended or adjusted under 35 U.S.C. 154(b) by 0 days.

(21) Appl. No.: 15/320,445

(22) PCT Filed: Jun. 18, 2015

(86) PCT No.: PCT/EP2015/063685
§ 371 (c)(1),
(2) Date: Dec. 20, 2016

(87) PCT Pub. No.: WO2015/193421
PCT Pub. Date: Dec. 23, 2015

(65) Prior Publication Data
US 2017/0184787 A1 Jun. 29, 2017

Related U.S. Application Data (60) Provisional application No. 62/014,930, filed on Jun. 20, 2014.

(51) Int. Cl.
G02B 6/28 (2006.01)
H01S 5/10 (2006.01)
H01S 5/40 (2006.01)

(52) U.S. Cl.
CPC .......... *G02B 6/2813* (2013.01); *H01S 5/1021* (2013.01); *H01S 5/4068* (2013.01)

(58) Field of Classification Search
CPC ..... H01S 5/1028; H01S 5/4068; H01S 5/1021
See application file for complete search history.

(56) References Cited

FOREIGN PATENT DOCUMENTS

CA    2537358        4/2007
WO    WO1992011562   7/1992

OTHER PUBLICATIONS

Zhang et al. Simple and compact V-cavity semiconductor laser with 50×100 GHz wavelength tuning. Opt. Express 21, 13564-13571 (2013).

(Continued)

*Primary Examiner* — Thomas A Hollweg
*Assistant Examiner* — Mary A El Shammaa
(74) *Attorney, Agent, or Firm* — Lumen Patent Firm (57) ABSTRACT A 3×3 multi-mode interference coupling device having a length L and a width W, a center input port between a pair of outer input ports, where each outer input port is displaced from the center input port by a distance W/3, and a center output port between a pair of outer output ports, where each outer output port is displaced from the center output port by a distance W/3, where the device is supports $C_{bar}$, $C_{cen}$, and a $C_x$ coupling coefficients therein, when the outer input ports are equally excited with an input signal having a 180° phase difference, $C_{cen}$ from each outer input port destructively interferes when the propagation length L is an integer number of $L_\pi/2$, where the device outputs equal intensity laser modes from each outer output port when the propagation length is an integer multiple of $L_\pi/2$.

2 Claims, 6 Drawing Sheets

(56) References Cited

OTHER PUBLICATIONS

Lin et al. Design and analysis of 2×2 half-wave waveguide couplers. Appl. Opt. 48, F18-F23 (2009).
He et al. Wavelength switchable semiconductor laser using half-wave V-coupled cavities. Opt. Express 16, 3896-3911 (2008).
Rosberg. 2004. Integrated optics in stellar interferometry: Realization of a 3×3 MMI beam combiner on planar glass substrate. DOPS-NYT Jan. 2003, pp. 15-19.
Staats et al. 2010. Integrated 3×3 Interferometer. Proc. IEEE Photonics Benelux 2010, Delft, The Netherlands, pp. 49-52.
Soldano et al. Optical Multi-Mode Interference Devices Based on Self-Imaging: Principles and Applications. J. Lightwave Technology 13 Apr. 4, 1995, pp. 615-627.
Kleijn et al. 2013. Multimode interference reflectors: A new class of components for photonic integrated circuits. J Lightwave Technology 31(8): 3055-3063.

PHASE DEPENDENT MULTIMODE INTERFERENCE DEVICE FOR COUPLED CAVITY LASERS

FIELD OF THE INVENTION

The present invention relates generally to lasers. More specifically, the invention relates to optical waveguides involving multimode interference.

BACKGROUND OF THE INVENTION

In literature, examples of Multimode Interference devices (MMI) with equal and unequal splitting ratios for N inputs and M outputs are known. The reported geometries are optimized for switching applications but so far little work on MMIs for coupled lasers has been performed. For the latter a MMI is desirable where the two output signals have a 180° phase difference, compared to the conventional 90°.

What is needed is a MMI device, which enables the integration of optical filters and widely tuneable laser architectures.

SUMMARY OF THE INVENTION

To address the needs in the art, a 3×3 multi-mode interference coupling device is provided that includes a length L and a width W, a center input port and a pair of outer input ports, where the center input port is disposed between the pair of outer input ports, where each outer input port is displaced from the center input port by a distance W/3, and a center output port and a pair of outer output ports, where the center output port is disposed between the pair of outer output ports, where each outer output port is displaced from the center output port by a distance W/3 where the 3×3 multi-mode interference device is capable of supporting a $C_{bar}$ coupling coefficient, a $C_{cen}$ coupling coefficient and a $C_x$ coupling coefficient therein, where when the pair of outer input ports are equally excited with an input signal that has a 180° phase difference, where the $C_{cen}$ coupling coefficient from each outer input port destructively interferes when the propagation length L is an integer multiple of $L_\pi/2$, where the 3×3 multi-mode interference device outputs laser modes from each outer output port, where the output laser modes are of equal intensity when the propagation length is an integer multiple of $L_\pi/2$.

According to one aspect of the invention, the length L includes a length of $5 L\pi/2$, where $C_{bar} \approx 0.78$, $C_{cen} \approx 0.57 e^{j\pi/3}$ and $C_{bar} \approx 0.21\ e^{j\pi}$.

In another aspect of the invention, the length L includes a length of $L\pi/2$, where $C_{bar} \approx 0.21$, $C_{cen} \approx 0.57 e^{j\pi/3}$ and $C_x \approx 0.78 e^{j\pi}$.

In one embodiment of the invention a 3×3 multi-mode interference coupling device is provided that includes a length $L=5 L\pi/4$ and a width W, a pair of input/output ports, where each input/output port is displaced from a center axis by a distance W/3, and a reflective surface, where the reflective surface includes a planar surface that is displaced from the input ports by the length $L=5 L\pi/4$, where the 3×3 multi-mode interference device is capable of supporting a $C_{bar}$ coupling coefficient, a $C_{cen}$ coupling coefficient and a $C_x$ coupling coefficient therein, where when the pair of input/output ports are equally excited with an input signal that has a 180° phase difference, the $C_{cen}$ coupling coefficient from each pair of input/output ports destructively interferes, where the 3×3 multi-mode interference device outputs laser modes from each pair of input/output port, where the $C_{bar} \approx 0.78$, the $C_{cen} \approx 0.57 e^{j\pi/3}$ and the $C_{bar} \approx 0.21 e^{j\pi}$.

In one aspect of this embodiment, the reflective surface includes a pair of symmetric reflective surfaces disposed on opposite sides of the central axis, where the pair of symmetric reflective surfaces are disposed at a 90-degree angle with respect to each other, where an apex of the 90-degree angle is along the central axis, where the length $L=L_\pi/4$, where $C_{bar} \approx 0.78\ C_{cen} \approx 0.57\ e^{j\pi/3}$ and $C_x \approx 0.21 e^{j\pi}$.

DETAILED DESCRIPTION

The current invention is a Multimode Interference device (MMI), which enables the realization of new integrated optical filters and widely tuneable laser architectures. According to one embodiment, the fabrication is based on UV-Lithograpy, which makes the laser especially attractive for low-cost applications in telecommunication and sensing. Embodiments of the invention are also compatible with any generic integration platform for photonic integrated circuits. Further, one or more waveguides are connected to a significantly wider multimode waveguide. According to one embodiment, a set of modes inside the wider multimode waveguide are excited by placing the inputs at predefined positions. The superposition of the excited modes leads to periodic imaging of the input fields after propagating through the multimode section. The type of images and periodicity depends strongly on the set of excited modes. In literature examples with equal and unequal splitting ratios for N inputs and M outputs are well explained. The reported geometries are optimized for switching applications but so far little work on MMIs for coupled lasers has been performed. For the latter the MMI of the current invention outputs two signals that have a 180° phase difference, compared to the conventional 90°.

Figure 1A:
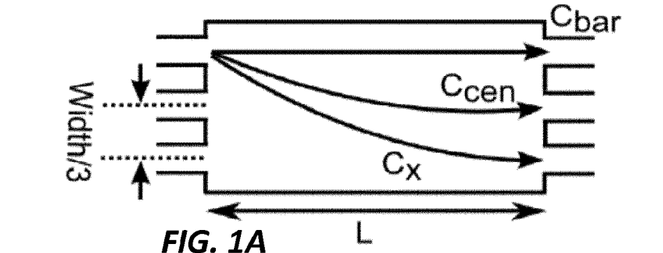
FIGS. 1A-1D show (FIG. 1A) 3×3 MMI geometry, (FIG. 1B) a BPM simulation of single input excitation of MMI, (FIG. 1C) excitation of the MMI with a 180 degree phase difference, and (FIG. 1D) related MMI coupler geometry with excluded middle waveguide, according to one embodiment of the current invention.

One embodiment of the current invention includes a 3×3 general interference MMI in transmission as shown in FIG. 1A. The 3×3 geometry produces images of equal intensity at the beat length $L_\pi$. Here, the guided-mode propagation method (MPA) is used to illustrate the self-imaging effect on the MMI device. In this aspect, the propagation constants $\beta_i$ (I=0, 1, 2, 3, . . . , N, where N is the number of guided modes) of the multi-modes in the MMI area are given in the paraxial approximation by:

$$\beta_0 - \beta_i \approx \frac{i(i+2)\pi}{3L_\pi}$$

where $L_\pi$ is defined as the beat length (or coupling length) between the fundamental mode (i=0) and the first-order mode (i=1):

$$L_\pi \equiv \frac{\pi}{\beta_0 - \beta_1} = \frac{4n_r W_e^2}{3\lambda}$$

where $\lambda$ is the free-space wavelength and $W_e$ is the effective width of the MMI area:

$$W_e \approx W + \frac{\lambda}{\pi}\left(\frac{n_c}{n_r}\right)^{2\sigma} / \sqrt{n_r^2 - n_c^2}$$

where W is the physical width of the MMI area, $n_r$ and $n_c$ are the effective core index and effective cladding index, respectively; and integer $\sigma=0$ for TE modes and $\sigma=1$ for TM modes.

Figure 1B:
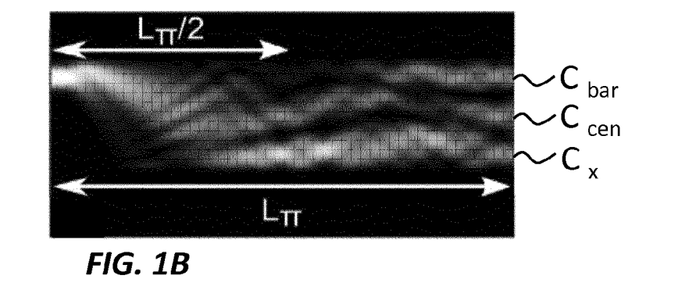
Figure 1C:
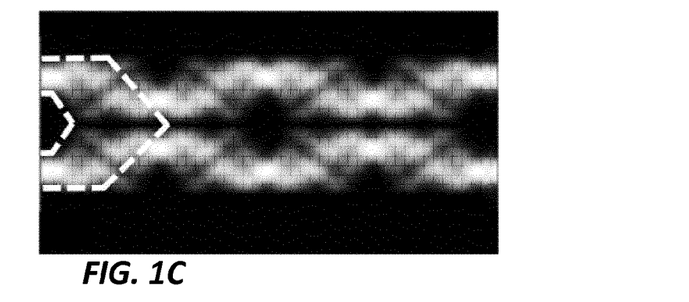

In FIG. 1B, shown is a numerical example of the propagation inside the multimode section of one embodiment of the current invention, where L is indicated. Here it is seen that at $L_\pi/2$ three images are present with unequal intensities such that $C_{bar}\approx 0.21$, $C_{cen}\approx 0.57\ e^{j\pi/3}$ and $C_x\approx 0.78e^{j\pi}$. By realizing that the phase difference between $C_x$ and $C_{bar}$ is 180°, a 2×2 coupler in the 3×3 geometry is provided when the central waveguide is excluded. Although this implies a significant imaging loss in general, no light is lost if the two outer inputs are simultaneously excited with almost equal intensities and a phase difference of 180°. Here, destructive interference occurs in the central output at multiples of $L_\pi/2$, as can be seen in FIG. 1C.

The amplitude coupling coefficients differ in each multiple of $L_\pi/2$. According to the current invention, six different possible solutions exist for the amplitude coupling coefficients and are shown in Table 1. For larger values of L, the coefficients repeat.

TABLE 1

Coupling Coefficients for different length of the 3 × 3 MMI

| Length | Coefficients |
| --- | --- |
| $L_\pi/2$ | $C_{bar} \approx 0.21$, $C_{cen} \approx 0.57e^{j\pi/3}$ and $C_x \approx 0.78e^{j\pi}$. |
| $L_\pi$ | $C_{bar} \approx 0.57$, $C_{cen} \approx 0.57e_j^{\pi}$ and $C_x \approx 0.57e^{1.33j\pi}$. |
| $3L_\pi/2$ | $C_{bar} \approx 0.7$, $C_{cen} \approx 0$ and $C_x \approx 0.7e^{1.5j\pi}$. |
| $2L_\pi$ | $C_{bar} \approx 0.57$, $C_{cen} \approx 0.57e^{-0.33j\pi}$ and $C_x \approx 0.57e^{-1.33j\pi}$. |
| $5L_\pi/2$ | $C_{bar} \approx 0.78$, $C_x \approx 0.57e^{j\pi/3}$ and $C_{bar} \approx 0.21e^{j\pi}$. |
| $3L_\pi$ | $C_{bar} \approx 0$, $C_x \approx 0$ and $C_{bar} \approx 1e^{2j\pi}$. |

Figure 1D:
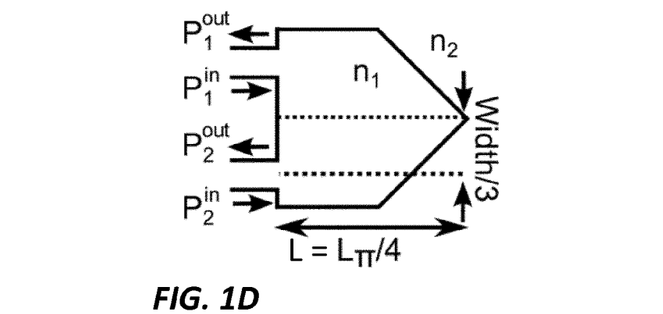
Figure 2:
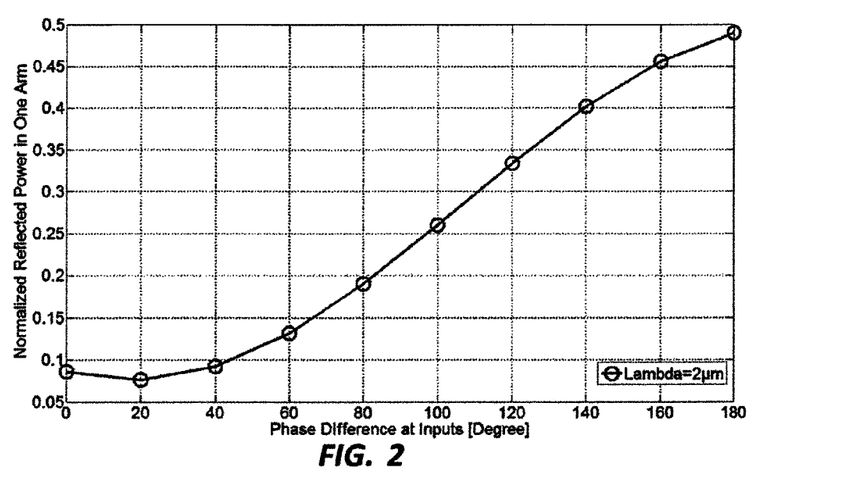
FIG. 2 shows a graph of the normalized power in each output port of the coupling MMI reflector shown in FIG. 1D, as a function of the phase difference between the inputs, according to one embodiment of the current invention.

In one embodiment, a fully reflective device is obtained by placing a corner mirror at half the distances reported in Table 1, as indicated in FIG. 1D. Due to the corner reflection, the coupling coefficients are interchanged. Note that ideal values reported in the table above only occur in reflection when the two input intensities are equal and their phase difference is 180°. For all other phase differences the imaging as shown in FIG. 1C is not optimal and a loss will occur. This property makes the current embodiment of the invention also a phase dependent reflector. The normalized reflection for each input port is depicted in FIG. 2 for different phase differences between inputs.

Figure 3A:
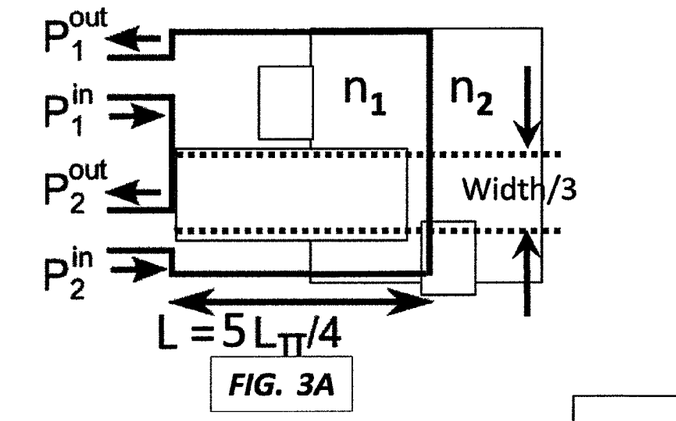
FIGS. 3A-3B show (FIG. 3A) 3×3 MMI geometry having a flat mirror at $5 L_\pi/4$, and (FIG. 3B) excitation of the MMI a having 180 degree phase difference showing the beat length $5 L_\pi/4$, according to one embodiment of the invention.
Figure 3B:
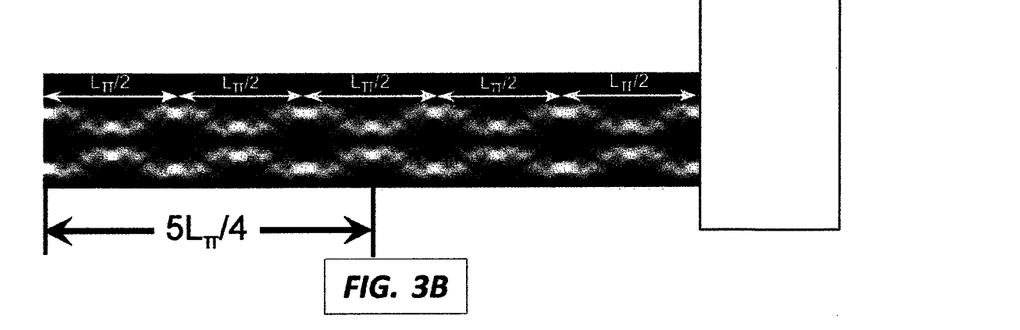

In another embodiment, a fully reflective device is obtained by placing a flat mirror at 5 $L_\pi/4$, as indicated in FIG. 3A, where the device is 5-times longer (see FIG. 3B) than the device shown in FIG. 1D. Again, the ideal values reported in the Table 1 above only occur in reflection when the two input intensities are equal and their phase difference is 180°. This property makes the current embodiment of the invention also a phase dependent reflector.

According to aspects of the embodiments of the invention, the two coupled cavities are coupled in a way, that little light is exchanged between them, e.g. $C_x < C_{bar}$, with a relative phase of ($\pi$), as shown in Table 1, where the coupling coefficients are summarized for a 3×3 MMI in transmission as shown in FIG. 1A. □□ Here, the proper coupling coefficients are only attainable for length of 5 $L\pi/2$ and repetition of 3 $L_\pi$.

Other embodiments of the invention include a 3×3 MMI with a length of $L\pi/2$, where the limitation of $C_x > C_{bar}$ is overcome by implementing the cavities such that they physically cross each other. □Further, a MMI reflector of this device is enabled if the length is halved and terminated with the corner reflective surface shown in FIG. 1D. Here, the corner reflector exchanges/inverts the coupling coefficients such that $C_{x'}$ becomes $C_{bar}$ and $C_{bar'}$ becomes $C_x$, where a coupled Fabry-Perot geometry is enabled. □□

Figure 4:
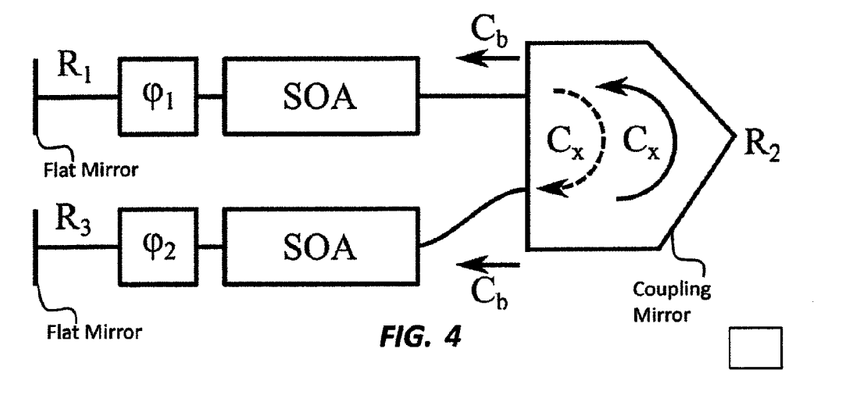
FIG. 4 shows a coupled cavity laser formed by using the reflector shown in FIG. 1D, according to one embodiment of the invention.

Turning now to some exemplary applications of these devices, where Fabry-Perot coupled cavity lasers are shown in FIG. 4. According to this exemplary implementation of the invention, a laser is formed by coupling two multimode laser cavities to create a single tuneable laser. This is based on the Vernier Effect. The coupling is done using the coupling mirror shown in FIG. 1D. According to further aspects of the invention, the MMI is used to couple two cavities such as Fabry-Perot Coupled Cavity Lasers, interferometer based on the MMI reflector, a Widely tunable Coupled Cavity laser, a Laser design with two internal cavity filters, and a Ring Coupled Cavity laser, or one Fabry-Perot and one ring. □

Figure 5A:
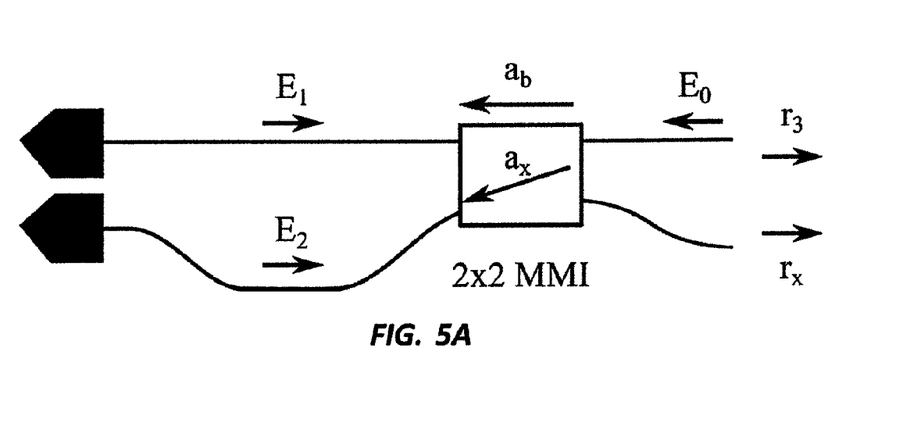
FIGS. 5A-5B show a comparison between a conventional Michelson Interferometer (FIG. 5A) and an interferometer formed using the MMI reflector shown in FIG. 1D, according to one embodiment of the invention.
Figure 5B:
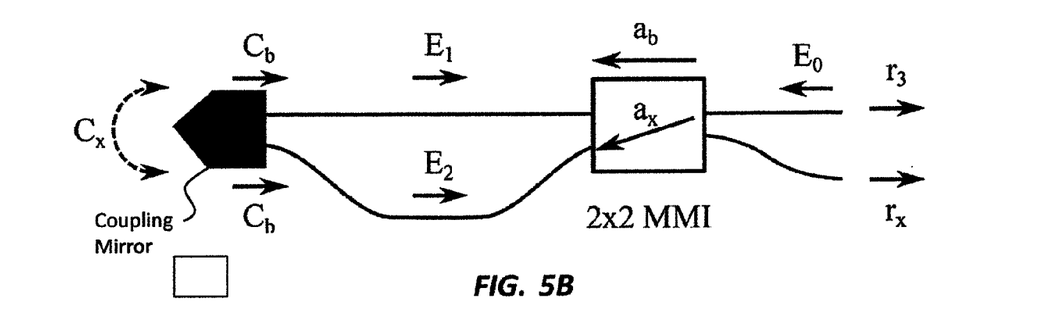
Figure 6:
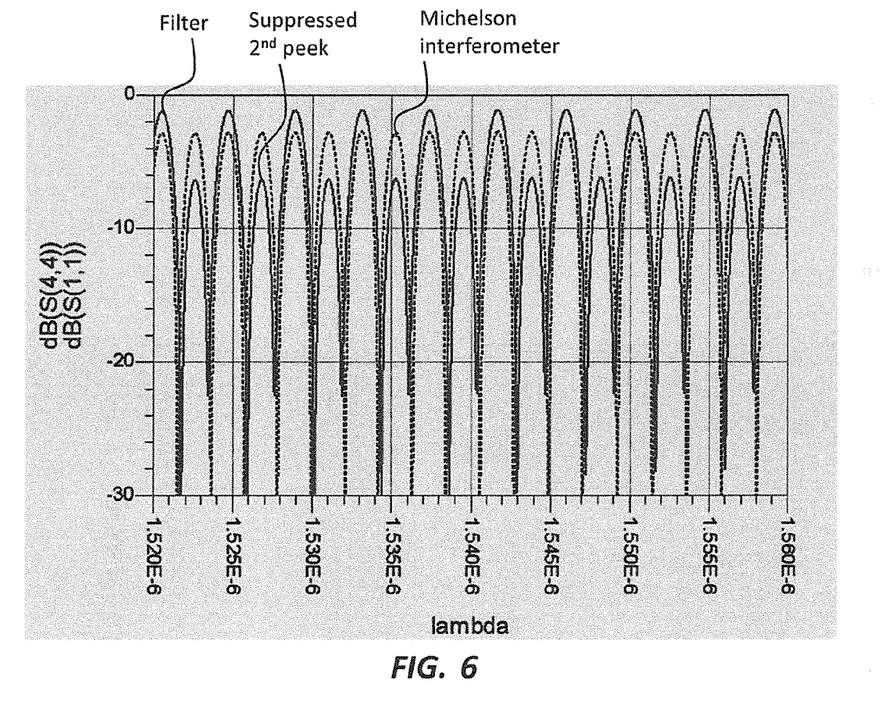
FIG. 6 shows a simulated spectral response of the conventional Michelson interferometer shown in FIG. 5A vs. the interferometer formed using the MMI reflector shown in FIG. 5B, according to the current invention.

An integrated Michelson Inteferometer is provided in FIG. 5A. In a further exemplary implementation, using the phase dependent reflection of the embodiment in FIG. 1D, an optical filter based on a Michelson Interferometer can be formed as shown in FIG. 5B. By using the fact that the component mainly reflects for a 180° phase difference between the two inputs, every second peak of the periodic Michelson response is suppressed (see FIG. 6). This enhances the effective Free Spectral Range of the optical filter by a factor of two, without changing the spectral width of the filter or the footprint. This ultimately doubles the tuning range in lasers employing similar interferometers.

Turning now to extended coupled cavity laser designs using the current invention, where two laser cavities (see FIG. 7), that by themselves emit multiple wavelengths, are coupled together through the mirror as shown in FIG. 1D. In this exemplary application, the cavities have different lengths and one of them may contain a wavelength dependent adjustable mirror (e.g. interferometer). The laser wavelength can be fine-tuned by means of current injection in one of the cavities and coarsely tuned when the effective mirror is altered, as shown in FIG. 9A.

The final lasing mode selection can be explained as follows. The grid spacing between two possible lasing modes within Laser 1 and Laser 2 of FIG. 7 and FIG. 9A depends on the length of the individual laser. Chosen slightly different, the coupling enforces a lasing wavelength where both grids coincide.

Figure 7:
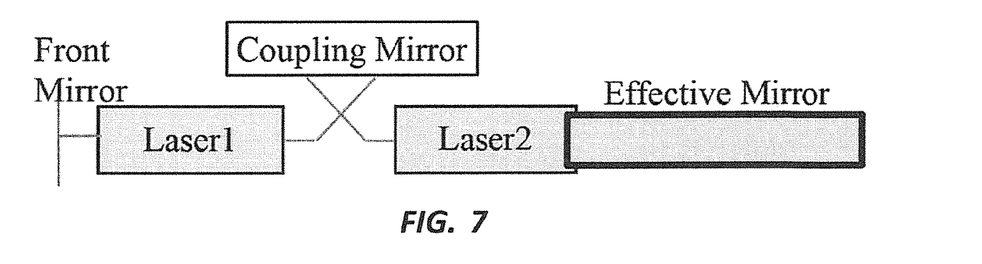
FIG. 7 shows a widely tunable coupled cavity laser formed using MMI reflector shown in FIG. 1D, according to the current invention.
Figure 8:
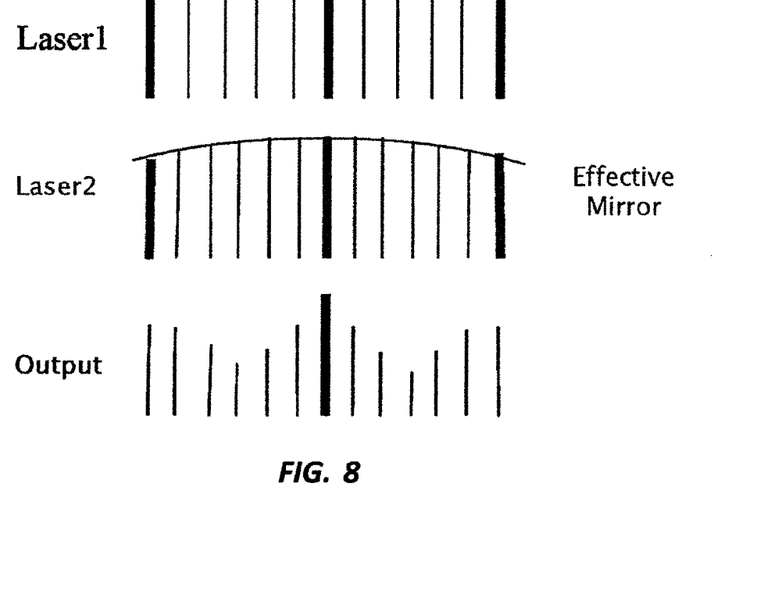
FIG. 8 shows a schematic diagram of the tuning principle of a coupled cavity, according to one embodiment of the invention.
Figure 9A:
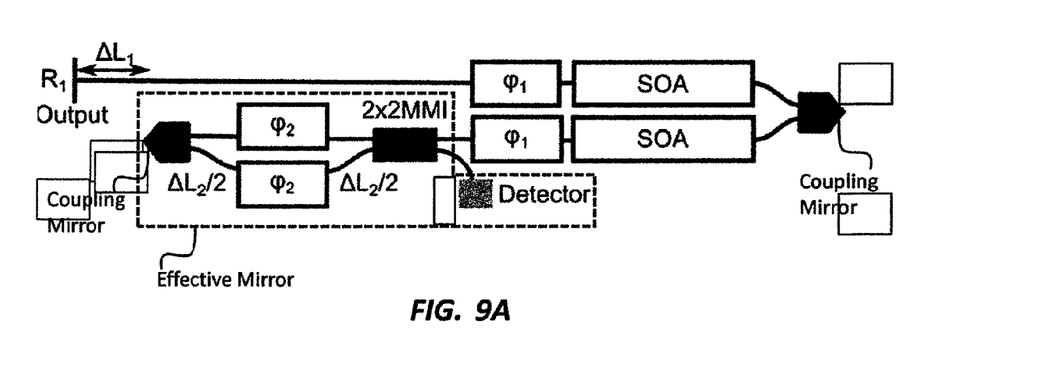
FIG. 9A shows a schematic diagram of the integrated coupled cavity laser in FIG. 7 with an interferometer in one cavity using two MMI reflectors shown in FIG. 1D, according to one embodiment of the invention.

According to the embodiment of FIG. 7 and FIG. 9A, if current is injected in one of the lasers, the laser can be tuned, as the two possible lasing grids are shifted with respect to each other. However, as the two grids are periodic, they might overlap also at a second wavelength further away. This usually limits the overall tuning range. To distinguish between the desired wavelength and an unwanted copy, a wavelength dependent filter is employed in one of the cavities. By tuning this mirror one of the remaining possibilities can be selected. This effect is illustrated schematically in FIG. 8 and FIG. 9B, where the bold lines represent the final lasing mode.

Figure 9B:
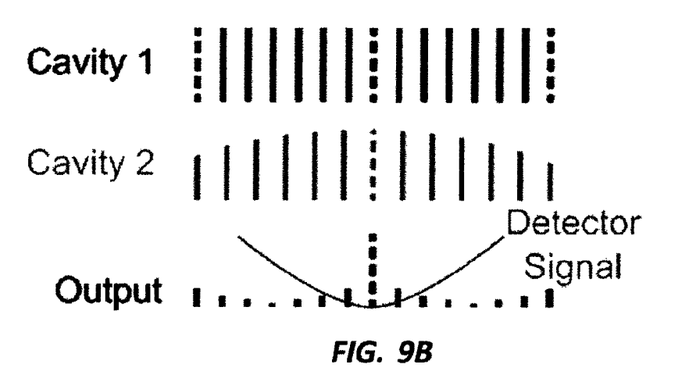
FIG. 9B shows a schematic diagram of the mode selection of the integrated coupled cavity laser with an interferometer in FIG. 9A, according to one embodiment of the invention.

The mode selection mechanism is shown in FIG. 9B. The Vernier effect between the two cavities, with a FSR determined by $\Delta L_1$ and the cavity length, is used for selecting one wavelength from the Fabry-Perot comb spectrum. The imbalance $\Delta L_2$ is chosen to suppress the competing wavelength one FSR away from the target mode in cavity 2. Consequently, the coupled system operates on the FSR, which coincides with the maximum reflection of the interferometer. Coarse tuning is accomplished via $\varphi_2$, with a range determined by the choice of $\Delta L_2$. The fine selection is achieved by adjusting the longitudinal modes of the cavities using the phase sections $\varphi_1$. During this process a photo current is generated on the detector, with a magnitude related to the selected longitudinal mode. The lasing mode, which coincides with the interferometer reflection peak produces the smallest current. In this way the laser can be stabilized by minimizing the detector current.

According to the embodiment shown in FIG. 7 and FIG. 9A, a widely tunable coupled cavity laser based on a Michelson Interferometer with doubled Free Spectral Range is provided. Shown are two coupled Fabry-Perot cavities with a length difference $\Delta L_f$, each containing an amplifier (SOA) and a phase tuning section $\varphi_1$. The two cavities are coupled via a 2-Port MIR coupling mirror, which introduces a 180° phase shift between its ports instead of the usual 90°. This is essential to ensure the wavelength selection with high SMSR. One cavity contains a tunable interferometer with imbalance $\Delta L_2$ and phase sections $\varphi_2$, which restricts the effective round trip gain bandwidth and allows coarse wavelength tuning. The other cavity is forming by a cleaved waveguide termination $R_1$. The 2×2 Multimode Interference splitter at the input of the interferometer, is connected with one port to an integrated photo detector which is used for stability control. The reflection spectrum of the interferometer is similar to a Michelson interferometer, but it provides precisely twice the Free Spectral Range (FSR), while maintaining the same Full-Width-Half maximum (FWHM).

Figure 11A:
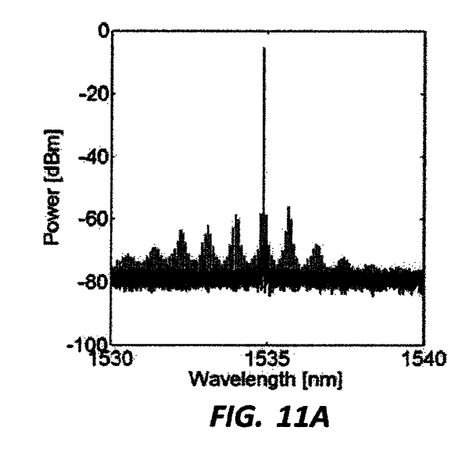
FIGS. 11A-11B show spectral results of a fabricated coupled cavity laser, according to one embodiment of the invention.
Figure 11B:
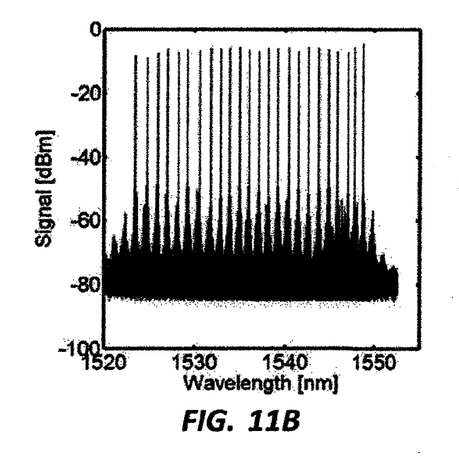

A prototype using 4 mm long cavities coupled together (where 2 mm are phase shifters) has been fabricated. The device is fully functional with 9 mW coupled to a lensed fiber. Typical spectral results are displayed in FIGS. 11A-11B, with SMSR above 40 dB and tunability of above 25 nm.

Figure 10:
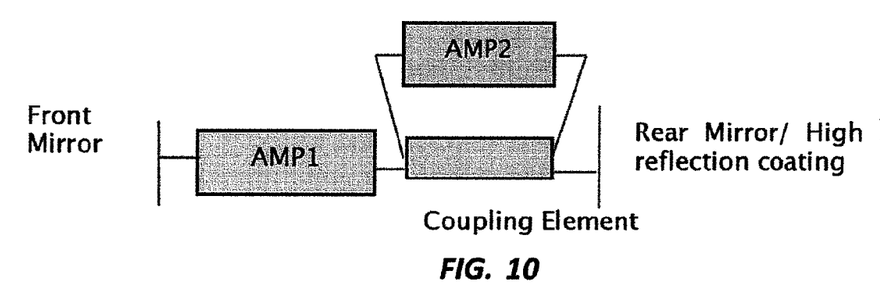
FIG. 10 shows a ring coupled cavity laser, according to one embodiment of the invention.

Turning now to a ring coupled cavity laser, where a Fabry-Perot cavity is coupled to a Ring. The structure is shown in FIG. 10. The coupling device used for this structure is 5 $L_\pi/2$ long, as reported in Table 1. The benefit of this structure is the possibility to use an effective reflection coating as mirror. This is an excellent alternative for platforms with poor integrated mirrors. Alternatively, the Fabry-Perot cavity can also be replaced by a ring, or the ring by a Fabry-Perot Cavity.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example a two ring-coupled laser, a two Fabry Perot type laser, or a mix of those. The effective mirror can be realized by any type of interferometer as e.g. Mach-Zehnders, Michelson, Ring Resontaors but also devices with a wavelength-dependent insertion loss as e.g multiplexers as Arrayed-Waveguide gratings or Echelle gratings. Further the device might be used to couple multiple cavities together, as e.g. three or four cavities.

All such variations are considered to be within the scope and spirit of the present invention as defined by the following claims and their legal equivalents.

What is claimed:

1. A two port phase dependent reflective multi-mode interference coupling device comprising:
   a) a multimode waveguide having a length L=5 L$\pi$/4 and a width W, wherein said length L$\pi$ is a coupling length between a fundamental optical mode (i=0) and a first order mode (i=1) according to $$L_\pi \equiv \frac{\pi}{\beta_0 - \beta_1} = \frac{4 n_r W_e^2}{3\lambda},$$

wherein $\beta_0$ and $\beta_1$ are propagation constants of the multimodes, wherein $\lambda$ is the free-space wavelength and $W_e$ is the effective width of the multimode waveguide area $$W_e \approx W + \frac{\lambda}{\pi}\left(\frac{n_c}{n_r}\right)^{2\sigma} / \sqrt{n_r^2 - n_c^2},$$

wherein said W is the physical width of said multimode waveguide area, wherein $n_r$ is the effective core index of said multimode waveguide, wherein $n_c$ is the effective cladding index of said multimode waveguide, wherein integer $\sigma=0$ for TE modes and $\sigma=1$ for TM modes;

b) a pair of input/output ports, wherein each said input/output port is displaced from the center axis of said multimode waveguide by a distance W/3, wherein said two port reflective multi-mode interference device is capable of supporting a $C_{bar}$ coupling coefficient and a $C_x$ coupling coefficient therein; and c) a reflective surface, wherein said reflective surface comprises a planar surface that is displaced from said input/output ports by said length L=5 L$\pi$/4, wherein said $C_{bar} \approx 0.78$, and said $C_x \approx 0.21 e^{j\pi}$, wherein when said pair of input/output ports are simultaneously excited with two input signals that have 180° phase difference and equal intensity said two port phase dependent reflective multi-mode interference device outputs signals with maximum intensity, wherein when each one of laser modes from two lasers are connected simultaneously to each one of said pair of input/output ports, each one of said laser modes coincide with a maximum reflection intensity of said reflective multi-mode interference device.

2. A two port phase dependent reflective multi-mode interference coupling device of claim 1, wherein said reflective surface comprises a pair of symmetric reflective surfaces disposed on opposite sides of said central axis, wherein said pair of symmetric reflective surfaces are disposed at a 90-degree angle with respect to each other, wherein an apex of said 90-degree angle is along said central axis, wherein said length L=$L_\pi$/4, wherein said $C_{bar} \approx 0.78$, and said $C_x \approx 0.21 e^{j\pi}$.

* * * * *